United States Patent
Condorelli et al.

(10) Patent No.: US 10,451,703 B2
(45) Date of Patent: Oct. 22, 2019

(54) METHOD OF INTERFACING A LC SENSOR AND RELATED SYSTEM

(71) Applicant: STMicroelectronics S.r.l., Agrate Brianza (IT)

(72) Inventors: Riccardo Condorelli, Tremestieri Etneo (IT); Daniele Mangano, San Gregorio di Cata (IT)

(73) Assignee: STIMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/213,534

(22) Filed: Dec. 7, 2018

(65) Prior Publication Data
US 2019/0107597 A1    Apr. 11, 2019

Related U.S. Application Data

(62) Division of application No. 14/739,195, filed on Jun. 15, 2015, now Pat. No. 10,162,038.

(30) Foreign Application Priority Data
Jul. 9, 2014 (IT) .............................. TO2014A0549

(51) Int. Cl.
*G01R 35/00* (2006.01)
*G01R 27/26* (2006.01)
(Continued)

(52) U.S. Cl.
CPC .......... *G01R 35/005* (2013.01); *G01D 3/028* (2013.01); *G01D 5/24* (2013.01); *G01R 27/2605* (2013.01);
(Continued)

(58) Field of Classification Search
CPC ...... G01R 35/005; G01R 35/00; G01R 27/28; G01R 27/2605; G01R 27/02
(Continued)

(56) References Cited

U.S. PATENT DOCUMENTS 4,279,257 A * 7/1981 Hochstein ............ A61B 5/0002
340/573.1
4,825,158 A * 4/1989 Watabe ................ G01N 27/023
324/237
(Continued)

FOREIGN PATENT DOCUMENTS

EP           0408084          7/1990

OTHER PUBLICATIONS

Hernitscheck, Christian "Rotation Detection with the MSP430 Scan Interface," Texas Instruments, Application Report, SLAA222A—Nov. 2004—Revised Apr. 2011, 61 pages.
(Continued)

*Primary Examiner* — Christopher P McAndrew
(74) *Attorney, Agent, or Firm* — Slater Matsil, LLP

(57) ABSTRACT

A method of interfacing a LC sensor with a control unit is provided. The control unit may include first and second contacts, where the LC sensor is connected between the first and the second contact. A capacitor is connected between the first contact and a ground. To start the oscillation of the LC sensor, the method may include during a first phase, connecting the first contact to a supply voltage and placing the second contact in a high impedance state such that the capacitor is charged through the supply voltage. During a second phase, the first contact may be placed in a high impedance state, and the second contact connected to the ground such that the capacitor transfers charge towards the LC sensor. During a third phase, the first contact and the second contact may be placed in a high impedance state so the LC sensor is able to oscillate.

19 Claims, 10 Drawing Sheets

(51) Int. Cl.
*G01R 27/02* (2006.01)
*G01D 3/028* (2006.01)
*G01D 5/24* (2006.01)
*H02J 7/04* (2006.01)
*H02J 7/34* (2006.01)

(52) U.S. Cl.
CPC .............. *H02J 7/045* (2013.01); *G01R 27/02* (2013.01); *G01R 35/00* (2013.01); *H02J 7/345* (2013.01)

(58) Field of Classification Search
USPC ......................................................... 324/601
See application file for complete search history.

(56) References Cited

U.S. PATENT DOCUMENTS

| | | | | |
|---|---|---|---|---|
| 4,973,912 A * | 11/1990 | Kaminski | ............ | B60R 21/0173 324/652 |
| 5,278,512 A * | 1/1994 | Goldstein | ............ | G01R 31/025 324/509 |
| 5,489,847 A * | 2/1996 | Nabeshima | ...... | G01R 33/34053 324/318 |
| 5,793,640 A * | 8/1998 | Wu | .................... | G01R 27/2605 324/600 |
| 6,560,567 B1 * | 5/2003 | Yechuri | ............. | G01R 31/2843 702/65 |
| 6,815,958 B2 * | 11/2004 | Kesil | ...................... | G01B 7/105 324/662 |
| 7,755,351 B2 * | 7/2010 | Brady | ................ | G01N 27/9046 324/222 |
| 8,174,283 B2 * | 5/2012 | Bhalla | ................ | G01R 31/2625 324/762.09 |
| 8,384,378 B2 * | 2/2013 | Feldkamp | .............. | A61B 5/053 324/228 |
| 8,610,442 B2 * | 12/2013 | Stevenson | .......... | G01R 27/2605 324/672 |
| 2009/0189619 A1 * | 7/2009 | Stevenson | .......... | G01R 27/2605 324/682 |
| 2012/0288951 A1 * | 11/2012 | Acharya | ................ | B82Y 30/00 436/113 |
| 2014/0028406 A1 * | 1/2014 | Cao | ...................... | H03B 5/1215 331/117 FE |
| 2014/0049273 A1 * | 2/2014 | Rocznik | ............. | G01R 27/2605 324/679 |

OTHER PUBLICATIONS

"Low Energy Sensor AN0029—Application Note"; Sep. 16, 2013 (Sep. 16, 2013) http://www.silabs.com/pages/Silabs-Search.aspx?q=LOW ENERGY SENSOR AN0029, Texas Instruments, Apr. 2011, pp. 1-23.

* cited by examiner

|  | 3.3V | | | 2.9V | | | 2.5V | | | 2.1V | | |
|---|---|---|---|---|---|---|---|---|---|---|---|---|
|  | -30°C | 25°C | 125°C | -30°C | 25°C | 125°C | -30°C | 25°C | 125°C | -30°C | 25°C | 125°C |
| R=3 Ohm | 6 | 9 | 9 | 6 | 9 | 10 | 6 | 9 | 9 | 7 | 10 | 7 |
| R=37 Ohm | 5 | 5 | 6 | 4 | 5 | 6 | 4 | 5 | 6 | 5 | 5 | 5 |
| R=45 Ohm | 4 | 4 | 5 | 4 | 4 | 5 | 4 | 4 | 5 | 4 | 4 | 4 |

METHOD OF INTERFACING A LC SENSOR AND RELATED SYSTEM

CROSS-REFERENCE TO RELATED APPLICATIONS

This application is a divisional of U.S. patent application Ser. No. 14/739,195, filed on Jun. 15, 2015, which application claims the benefit of Italian Patent Application No. TO2014A000549, filed Jul. 9, 2014, which applications are hereby incorporated herein by reference.

TECHNICAL FIELD

Embodiments of the present disclosure relate to techniques for interfacing an LC sensor.

BACKGROUND

LC sensors are well known in the art. For example, LC sensors may be used as electronic proximity sensors which are able to detect the presence of a conductive target. Some common applications of inductive sensors include, e.g., metal detectors and derived applications, such as rotation sensors.

FIG. 1 shows the basic behavior of an LC sensor 10. Specifically, in the example considered, the LC sensor 10 includes an inductor L and a capacitor C, which form a resonant circuit also called tank circuit. The arrangement further includes a power supply 102, such as a voltage source, and a switch 104.

When the switch 104 is in a first position (as shown in FIG. 1), the capacitor C is charged up to the supply voltage. When the capacitor C is fully charged, the switch 102 changes position, placing the capacitor 102 in parallel with the inductor L, and it starts to discharge through the inductor L. This starts an oscillation between the LC resonant circuit 10.

From a practical point of view, the LC sensor 10 also includes a resistive component R, which will dissipate energy over time. Accordingly, losses occur which will decay the oscillations, i.e., the oscillation is dampened.

Such an LC sensor 10 may be used, e.g., to detect metallic objects. This is because the oscillation will be damped quicker in the presence of a metallic object (see, e.g., FIG. 2b) compared to an oscillation without a metallic object (see, e.g., FIG. 2a). Generally speaking, the sensing component of an LC sensor 10 may be the inductor L, the capacitor C and/or the resistor R. For example, the resistance R primarily influences the damping factor, while the L and C component primarily influence the oscillation frequency.

Moreover, such a LC sensor 10 may also be created by simply connecting a capacitor C to an inductive sensor L, or an inductor L to a capacitive sensor C. However, the inductor L (with its dissipative losses) usually provides the sensing element.

FIG. 3a shows a possible embodiment for performing the LC sensing of the sensor 10 with a control unit 20, such as a microcontroller, as described, e.g., in the documents Application Note AN0029, "Low Energy Sensor Interface—Inductive Sensing", Rev. 1.05, 2013-05-09, Energy micro, or Application Report SLAA222A, "Rotation Detection with the MSP430 Scan Interface", April 2011, Texas Instruments. In the example considered, the control unit 20 has two pins or pads 202 and 204, and the LC sensor 10 is connected between these pins 202 and 204.

The control unit 20 includes a controllable voltage source 206 connected to the pin 202 to impose a fixed voltage $V_{MID}$ at this pin 202. For example, a digital-to-analog converter (DAC) is typically used for this purpose.

During a charge phase, the pin 204 is connected to ground GND. Accordingly, during this phase, the sensor 10 is connected between the voltage $V_{MID}$ and ground GND, and the capacitor C of the sensor 10 is charged to the voltage $V_{MID}$.

Next, the control unit 20 opens the second pin 204, i.e., the pin 204 is floating. Accordingly, due to the fact that the capacitor C of the sensor 10 has be charged during the previous phase, the LC resonant circuit 10 starts to oscillate as described above.

Thus, by analyzing the voltage, e.g., voltage V204 at pin 204, the oscillation may be characterized. In fact, as shown in FIG. 3b, the voltage at the pin 204 corresponds to a damped oscillation having a DC offset corresponding to the voltage $V_{MID}$, imposed by the voltage source 206, i.e., the voltage $V_{MID}$ defines the middle point of the oscillation. Accordingly, the voltage $V_{MID}$ is usually set to half of the supply voltage of the control unit 20, e.g., VDD/2, in order to have the maximum range.

Often, the circuit also includes an additional capacitor C1 connected between the pin 202 and ground GND to stabilize the voltage signal $V_{MID}$ and to provide the boost of current required to charge the sensor. In order to analyze the signal at the pin 204 (see, e.g., FIG. 3a), the control unit 20 may include an analog-to-digital converter (ADC) 208 connected to the pin 204 to sample the voltage of the oscillation. Thus, based on the resolution and sampling frequency of the ADC 206, the whole oscillation may be characterized.

FIG. 4 shows an alternative approach. More specifically, in the illustrated example, the control unit 20 comprises a comparator 210 which compares the voltage at the pin 204 with a reference signal, such as a reference voltage $V_{Ref}$. For example, this reference voltage $V_{Ref}$ may be fixed, e.g., to VDD/2, or set via a digital-to-analog converter 212. For example, FIGS. 5a and 5b respectively show the oscillations with and without a metallic object in the vicinity of the sensor 10, along with a possible reference voltage $V_{Ref}$ and the output CMP of the comparator 210. Generally, the two approaches shown in FIGS. 3a and 4, i.e., the ADC 208 and comparator 210, may also be combined in the same control unit 20.

Thus, based on the foregoing, contactless motion measurement may be achieved by interfacing LC sensors directly with microcontroller integrated circuits (ICs). Such sensing may be useful, e.g., for metering systems (gas, water, distance, etc.). However, while handling and sampling sensors, microcontrollers (or MCUs) should reduce as much as possible the power consumption to permit the development of battery-powered systems. Moreover, as MCU units are typically general-purpose, there is also the need to reduce as much as possible the silicon area due to the specialized circuits required for the implementation of the above functionality.

Accordingly, in LC sensor excitation and measurement techniques it is important to reduce consumption and cost, especially for battery powered applications as already mentioned. Thus, a first problem is related to the use of dedicated low power analog components, e.g., for generating the voltage $V_{MID}$ and the internal reference voltage $V_{Ref}$ which results in a greater cost.

A second problem is related to the digital-to-analog converter 212 that should be both low power and fast enough to follow the dumped oscillation. This leads to significant power consumption per measurement, and challenging application constraints in battery-powered systems.

Furthermore, Process-Voltage-Temperature (PVT) variations are another important issue in battery-powered systems, where there are significant voltage changes. Indeed, most of the components described in the foregoing could be affected by the PVT variations, including: sensors (damping factor, frequency, etc.); I/O pads current and resistance (excitation); comparators switching point, etc.

SUMMARY

Based upon the foregoing, there is a need for approaches which overcome one or more of previously outlined drawbacks.

Such an object is achieved through a method having the features specifically set forth in the claims that follow. A related system is provided, as well as a corresponding related computer program product, loadable in the memory of at least one computer and including software code portions for performing the steps of the method of the invention when the product is run on a computer. As used herein, reference to such a computer program product is intended to be equivalent to reference to a computer-readable medium containing computer-readable instructions for controlling a computer system to coordinate the performance of the method of the invention. Reference to "at least one computer" is intended to highlight the possibility for the present invention to be implemented in a distributed/modular fashion. The claims are an integral part of the disclosure of the invention provided herein. The claims are an integral part of the technical teaching of the invention provided herein.

As mentioned above, the present description provides approaches for interfacing a LC sensor with a control unit, such as a microcontroller, where the control unit comprises a first and a second contact, such as the pins or pads of a microcontroller. In particular, the LC sensor is connected between two contacts and an additional capacitor is connected between the first contact and a ground.

In some embodiments, the oscillation of the LC sensor is started by three phases. More specifically, during the first phase, the first contact is connected to a supply voltage and the second contact is placed in a high impedance state, e.g., disconnected, such that the capacitor is charged through the supply voltage provided at the first contact. During the second phase, the first contact is placed in a high impedance state, e.g., disconnected, and the second contact is connected to ground, whereby the capacitor is connected in parallel with the LC sensor and charge is transferred from the capacitor towards the LC sensor. During the third phase, both contacts are placed in a high impedance state, such that the LC sensor is able to oscillate. Accordingly, the oscillation of the LC sensor may be started with a three state driver circuitry, e.g., of a microcontroller.

In some embodiments, the duration of the second phase, i.e., the charge transfer phase, is varied to regulate the voltage at the capacitor at the beginning of the third phase (i.e., the oscillation phase). This defines the middle point voltage of the oscillation occurring at the second contact.

In some embodiments, the voltage at the second contact is monitored at least during the third phase to determine some characteristics of the oscillation of the LC sensor. For example, the voltage at the second contact may be compared with at least one reference voltage in order to generate a comparison signal. In this case, the number of pulses in the comparison signal may be counted to characterize the oscillation. Accordingly, the oscillation of the LC sensor may be monitored with an input sensing circuitry, e.g., of a microcontroller.

In some embodiments, the number of pulse is also used to regulate the middle point voltage of the oscillation occurring at the second contact. For example, this may be done by varying the duration of the second phase, i.e., the charge transfer phase.

In some embodiments, the charge or discharge behavior of the capacitor may be analyzed via a comparator with hysteresis during a calibration phase. The middle point voltage of the oscillation occurring at the second contact may be regulated by recharging or discharging the capacitor between the second and third phase based on the charge or discharge behavior of the capacitor determined during the calibration phase. Accordingly, the middle point voltage of the oscillation may also be regulated with the three state driver circuitry, e.g., of a microcontroller.

BRIEF DESCRIPTION OF THE DRAWINGS

Embodiments of the present disclosure will now be described with reference to the annexed drawings, which are provided by way of non-limiting example, and in which:

FIG. 3b is a graph of voltage oscillation of the LC sensor of FIG. 3a;

FIG. 13 is a table providing exemplary results obtained with the systems of FIGS. 6, 7, 9, 10 and 12.

DETAILED DESCRIPTION OF ILLUSTRATIVE EMBODIMENTS

In the following description, various specific details are given to provide a thorough understanding of embodiments. The embodiments may be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. The headings provided herein are for convenience only and do not interpret the scope or meaning of the embodiments.

In the following FIGS. 6 to 16, parts, elements or components which have already been described with reference to FIGS. 1 to 5 are denoted by the same references previously used in such figures. As such, the description of such previously described elements will not be repeated in the following description.

The embodiments described herein provide approaches that permit an efficient handling of at least one LC sensor 10 by reducing the required dedicated on-chip components and/or by providing reduced power consumption. Some embodiments may also be implemented in a full digital manner with a conventional low cost microcontroller, thus reducing cost.

Various embodiments may provide an improved resilience against PVT variations (particularly suitable for battery powered systems). In some embodiments, the approach is based on two different techniques, namely Capacitive Dynamic Charge Sharing (CDCS) and Self-Tuning Reference (STR). In some embodiments, such an approach applies a capacitive dynamic charge sharing to remove the $V_{MID}$ generator and the $V_{Ref}$ Generator 206/212 shown with respect to FIGS. 3a and 4, and to use a Self-Tuning Reference technique to permit the use of a fixed internal reference and to improve robustness against PVT variations.

Capacitive Dynamic Charge Sharing

As mentioned above, the Capacitive Dynamic Charge Sharing (CDCS) technique allows for the removal of the $V_{MID}$ voltage generator module. More particularly, this approach is based on the fact that, in a very short time, the inductance L of the sensor 10 is such that the capacitor C1 and the capacitor C of the sensor 10 are connected in series.

Figure 6:
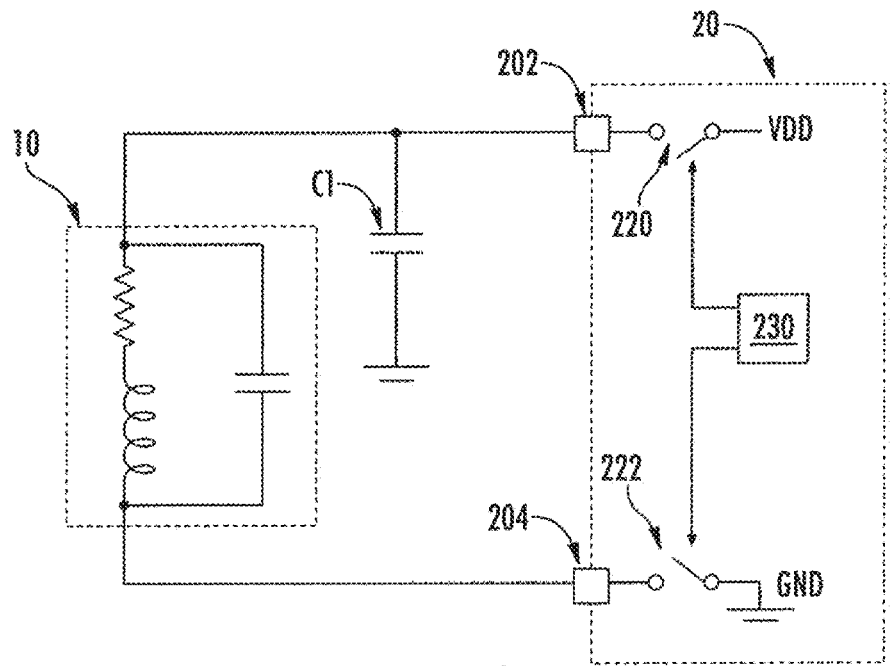
FIGS. 6, 7, 9, 10 and 12 are schematic diagrams illustrating systems for interfacing an LC sensor in accordance with example embodiments.

FIG. 6 shows the basic architecture of this approach. More specifically, in the illustrated embodiment the LC sensor 10 is connected again (e.g., directly) between the pins 202 and 204 of the control unit 20, such as a microcontroller. Moreover, a capacitor C1 is connected (e.g., directly) between the pin 202 and ground GND. As will be described further below, the capacitor C1 is used in a different manner as compared to the prior art approaches described with respect to FIGS. 3b and 4.

In the illustrated embodiment, the control unit 20 does not include a dedicated DAC for generating the voltage $V_{MID}$, but the control unit 20 merely includes a switch 220 configured to selectively connect the pin 202 to a fixed voltage, such as the supply voltage VDD of the control unit 20 or a voltage signal provided by an internal voltage reference generator, which is often available in conventional microcontrollers. Generally speaking, the supply voltage VDD may be received via a power supply pin of the control unit 20 (not shown). Accordingly, the pin 202 may be either floating or connected to a supply voltage. For example, in some embodiments the operation of the switch 202 may be implemented with a convention three state driver circuitry, e.g., "1" for VDD, "o" for GND and "Z" for a high impedance state, which is often used for output pins of microcontrollers or other digital integrated circuits.

In the present embodiment, the control unit 20 includes a further switch 222 configured to connect the pin 204 selectively to ground GND. Thus, the operation of the switch 222 may be implemented also with the conventional driver circuitry of an output pin of a microcontroller.

The switching of the switches 220 and 222 is controlled by a processing unit 230, such as a digital processing unit programmed via software instructions. For example, this may be the central processing unit (CPU) of a microcontroller or a dedicated digital IP. Accordingly, in some embodiments (see, e.g., FIG. 7), the above-described driving of the pads 202 and 204 may be implemented with conventional three state driving circuits 240 and 242, e.g., of a microcontroller 20.

Figure 8:
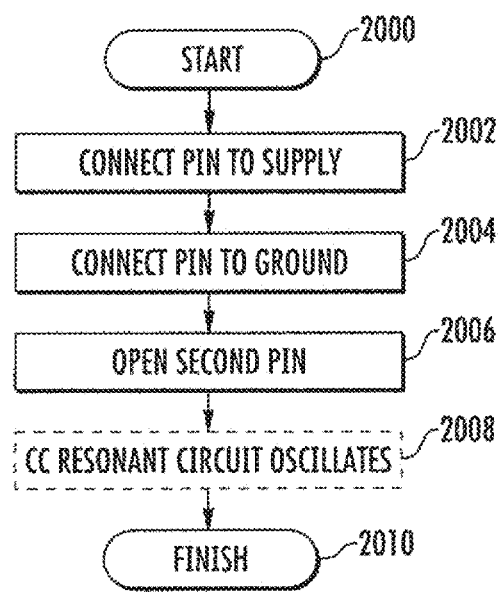
FIGS. 8, 14, and 15 are flow diagrams illustrating methods for interfacing an LC sensor which may be used in the systems of FIGS. 6, 7, 9, 10 and 12.

FIG. 8 shows a flow chart of the main operations performed by the control unit 20 to start an oscillation of the LC sensor 10. After a start step 2000, the control unit 20 connects in a step 2002 the pin 202 to a supply signal, such as the supply voltage VDD of the microcontroller 20, and the pin 204 is floating. For example, the processing unit 230 may drive the pin 202 with the logic level "1" and the pin 204 with the logic level "Z". Accordingly, in the step 2002, only the capacitor C1 is connected between the supply voltage VDD and ground GND, and the capacitor C1 is charged.

Next, the control unit 20 connects the pin 204 to ground GND in a step 2004, while the pin 202 is floating. For example, the processing unit 230 may drive the pin 202 with the logic level "Z" and the pin 204 with the logic level "o". Accordingly, in the step 2004 the sensor 10 is connected in parallel with the capacitor C1, and the charge on the capacitor C1 is transferred at least partially to the capacitor C and generally the sensor 10, i.e., the charge of the capacitor C1 is shared with the sensor 10.

Next, the control unit 20 opens the second pin 204 in a step 2006, i.e., both pins 202 and 204 are floating. For example, the processing unit 230 may drive both the pin 202 and the pin 204 with the logic level "Z". Accordingly, due to the fact that the LC sensor 10 has been charged during the step 2006, the LC resonant circuit 10 starts to oscillate in the step 2008, as described above. Finally, the procedure terminates at a step 2010.

The driving scheme may also include an optional step 2008, in which the oscillation is stopped. For example, this might be useful if multiple consecutive measurements have to be performed. As shown in FIG. 8, this step 2008 may be performed at the end of a measurement (after step 2006) or could be performed at the beginning of a new measurement, e.g. before step 2002. For example, during the step 2008, both pads 202 and 204 may be connected to ground, e.g., the processing unit 230 may drive both the pin 202 and the pin 204 with the logic level "0", in order to discharge the capacitors C1 and C.

The above description is applicable to a single sensor 10. However the system may also be extended to multiple sensors, e.g., by using a single pad 202 and a respective sensing pad 204 for each LC sensor. Generally speaking, the amount of charge transferred during the step 2004 depends on the excitation time $T_{excit}$, in which the switch 222 remains closed while the switch 220 is opened, i.e., the duration of the step 2004.

Basically, if the time $T_{excit}$ is sufficiently short, the inductor L of the sensor may be assumed open and at the end of the step 2004 the total charge originally stored in the capacitor C1 will be redistributed between the two capacitors C1 and C, and the voltage at the capacitors C1 and C will be given by the capacitor divider formula. For example, in case the two capacitors C1 and C have the same capacitance and assuming instantaneous charge transfer, the voltage on the capacitor C1 and the capacitor C would reach half of the voltage supply signal VDD.

However, it will be appreciated that the charge transfer is indeed not "instantaneous", e.g., due to resistive loads between the capacitor C and C1, and the inductor L cannot be assumed always open during the time $T_{excit}$. That is the capacitor C1 will also discharge through the inductor L. As a consequence, the final voltages at the capacitor C1 and the capacitor C depend on the time $T_{excit}$, i.e., the voltages reached by the capacitor C1 and the sensor capacitor C (at the end of the step 2004 and the beginning of step 2006) depend on the excitation time $T_{excit}$.

Figure 7:
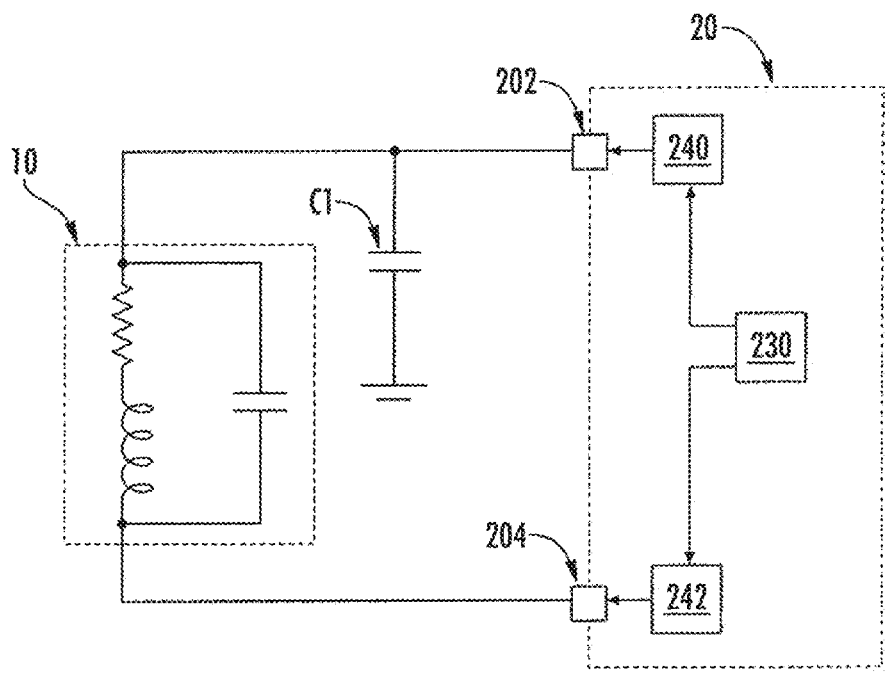

Accordingly, the Capacitive Dynamic Charge Sharing (CDCS) technique shown in FIGS. 6 and 7 is based substantially on a capacitive divider principle (exploiting existing components) applied during a transitory period. Specifically, in the embodiment considered, the capacitor C1 is pre-charged to VDD, and the charge is transferred partially to the sensor 10 as a function of the duration $T_{excit}$ of the step 2004, i.e., while pin 202 is floating and pin 204 is connected to ground. However, as described above, the voltage at the capacitor C1 during the step 2006, in which the LC sensor is oscillating, constitutes the middle point voltage $V_{MID}$ of the oscillation. Accordingly, by controlling the duration Texcit, it is possible to regulate the voltage $V_{MID}$, i.e., the voltage at the capacitor C1 at the end of the step 2004 or the beginning of step 2006.

Self-Tuning Reference

The Self-Tuning Reference (STR) technique, when used in conjunction with the previously described Capacitive Dynamic Charge Sharing (CDCS) technique, permits the use of a simple comparator with fixed (e.g., internal) reference value $V_{Ref}$ to analyze the oscillation during the step 2006. Accordingly, no digital-to-analog converter (e.g., block 208 in FIG. 3*a*) or controllable voltage reference (e.g., block 212 in FIG. 4) is required.

Figure 9:
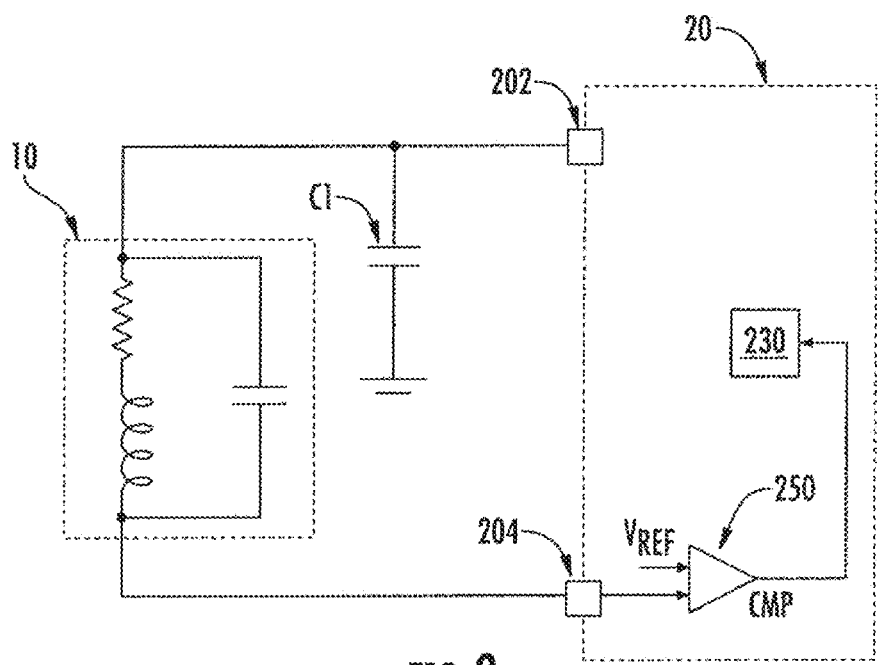

For example, as shown in FIG. 9, a comparator 250 may be connected to the pin 204 and compare the voltage at the pin 204 with a fixed reference value $V_{Ref}$. The result of the comparison CMP may then be made available to the processing unit 230, e.g., the digital processing core of a microcontroller, which may be configured for analyzing the sequence of pulses in the signal CMP.

For example, in some embodiments, a comparator with hysteresis, such as a Schmitt Trigger, with fixed thresholds may be used to analyze the oscillation. For example, such Schmitt Triggers with fixed thresholds are often used in the sensing circuitry of the input pads of microcontrollers or other digital integrated circuits. Accordingly, no additional components may be required and the conventional sensing circuitry of an input pin of microcontroller may be used.

Figure 10:
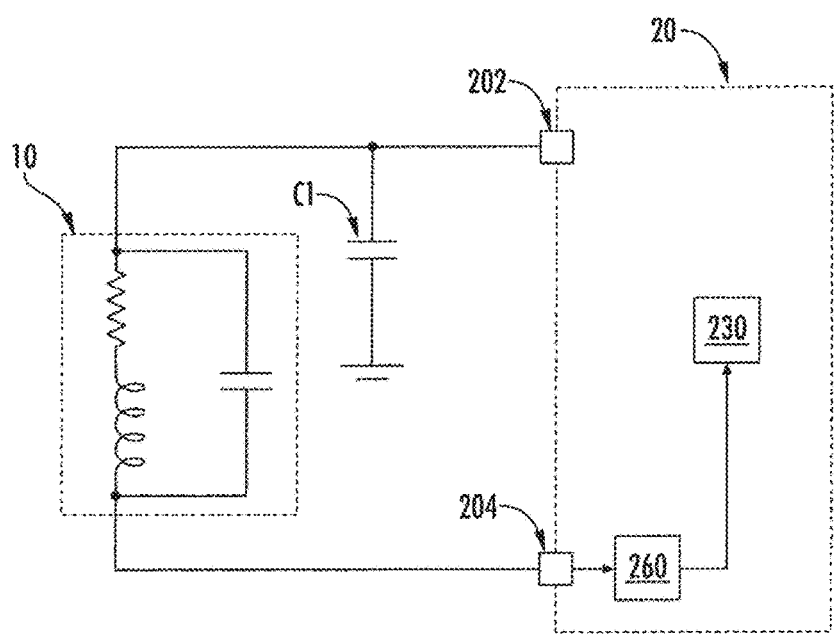

By way of example, as shown in FIG. 10, the conventional sensing circuitry 260 of an input pad, e.g., of a microcontroller, may be used to implement the comparator 250. Accordingly, the result of the comparison may be directly available to the processing core 230 by merely "reading" the value associated with the input pad 204.

Figure 1:
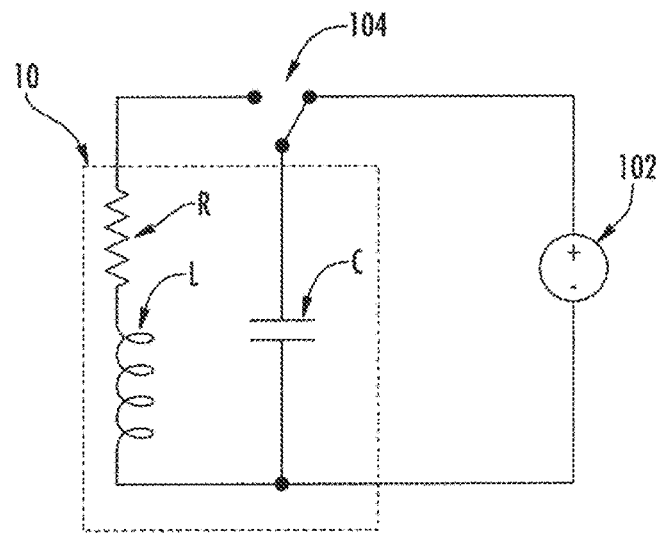
FIG. 1 is a schematic diagram of an LC sensor in accordance with the prior art.
Figure 2A:
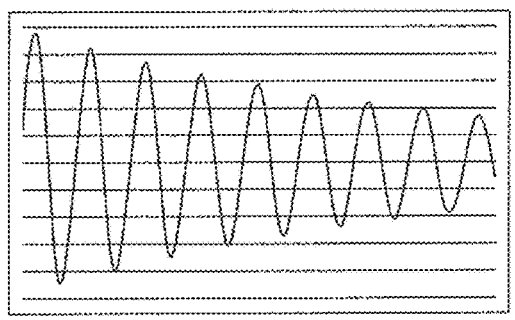
FIGS. 2a and 2b are graphs of voltage oscillation of the LC sensor of FIG. 1 with and without a metallic object present, respectively.
Figure 2B:
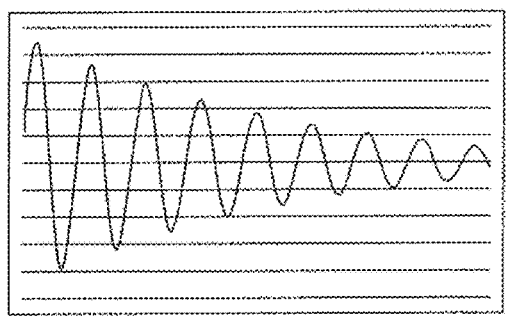
Figure 3A:
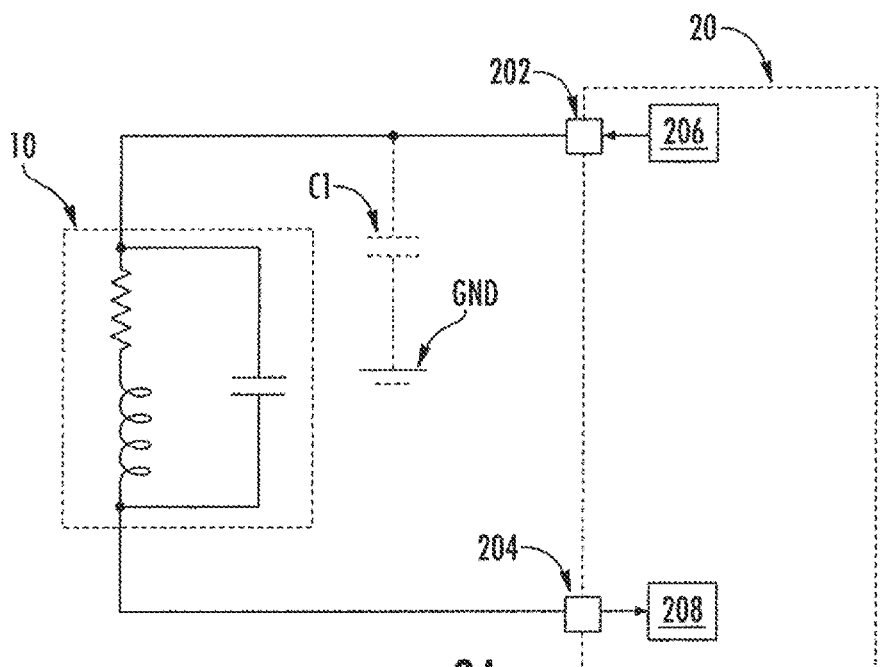
FIG. 3a is a schematic diagram illustrating another LC sensor arrangement including a controller in accordance with the prior art.
Figure 3B:
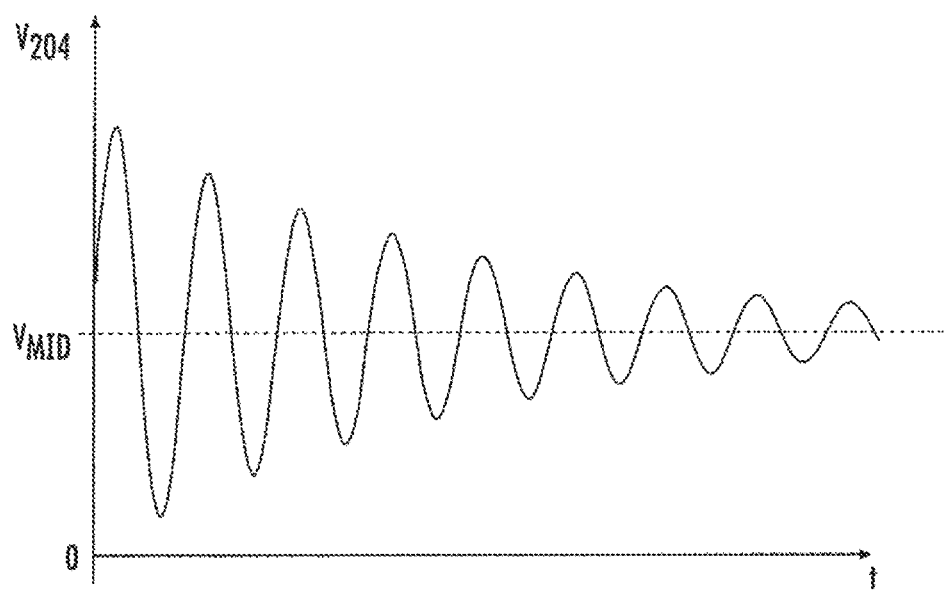
Figure 4:
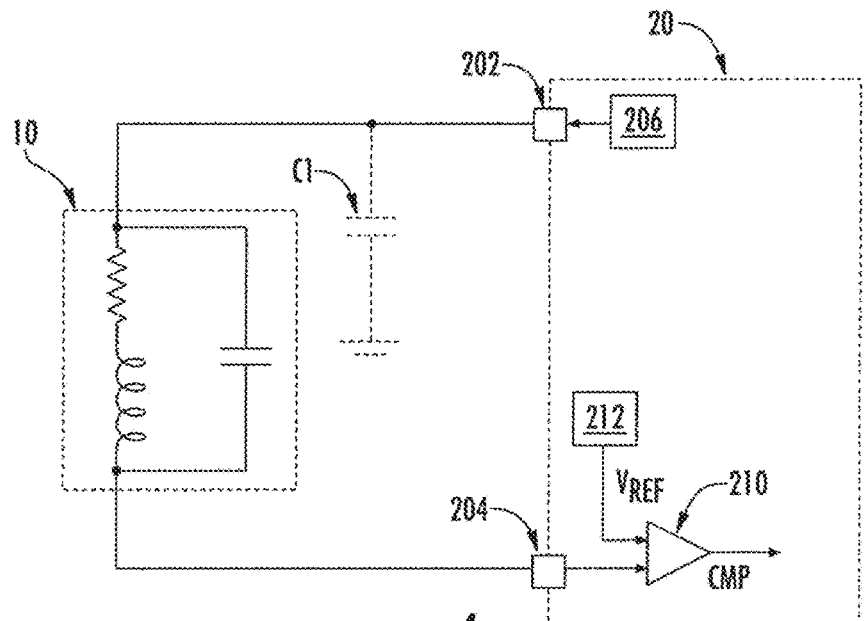
FIG. 4 is a schematic diagram of another LC sensor arrangement including a controller in accordance with the prior art.
Figure 5A:
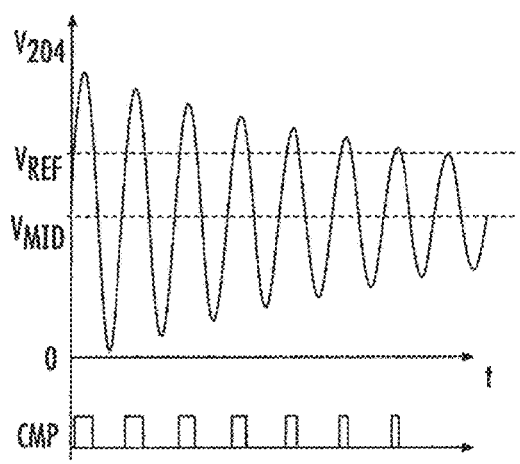
FIGS. 5a and 5b are graphs of voltage oscillation of the LC sensor arrangement of FIG. 4 with and without a metallic object present, respectively.
Figure 5B:
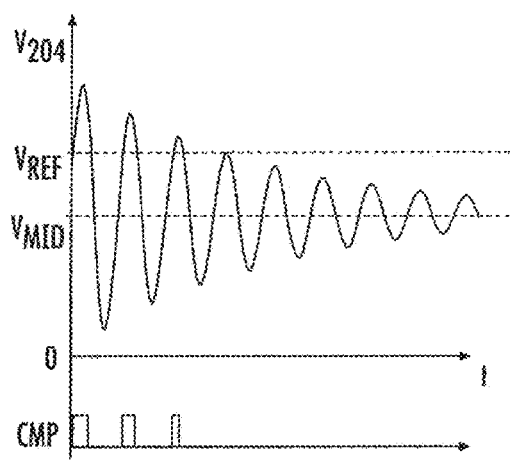

In the prior-art approach described with respect to FIG. 4, the possibility of tuning the internal reference voltage $V_{Ref}$ via the source 212 usually permits setting a reference value $V_{Ref}$ which ensures that enough digital pulses are generated at the output CMP of the comparator, but not too many pulses to avoid a waste of time and power (see also FIGS. 5*a* and 5*b*). Conversely, in some embodiments, the above-mentioned Capacitive Dynamic Charge Sharing technique is used to selectively vary the middle point voltage $V_{MID}$ of the oscillation instead of the threshold voltage of the comparator 250. Accordingly, the role of $V_{MID}$ and $V_{Ref}$ are swapped, i.e., by moving the Voltage $V_{MID}$, the number of digital pulses may be varied in a substantially similar way as moving the voltage $V_{Ref}$.

Figure 11A:
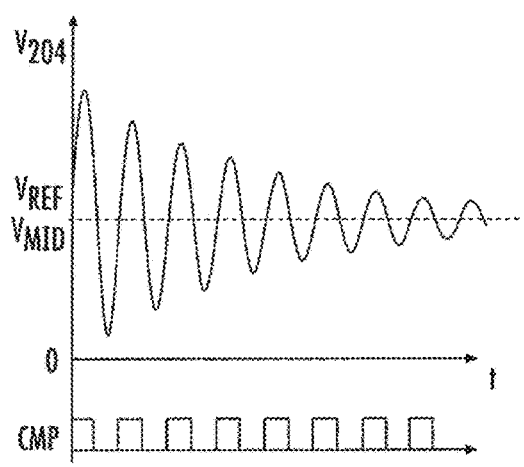
FIGS. 11a-11d and 16 are graphs illustrating exemplary waveforms which may occur in the systems of FIGS. 6, 7, 9, 10 and 12.
Figure 11B:
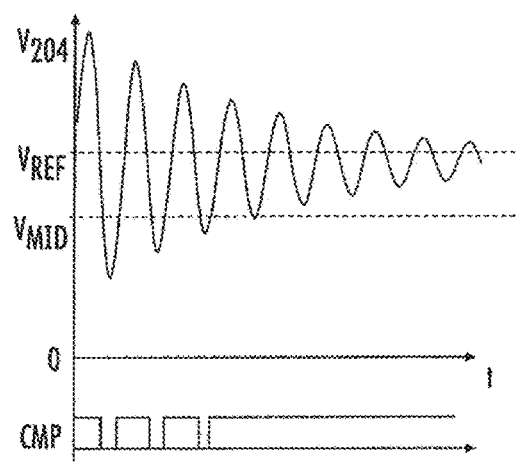

By way of example, FIG. 11*a* shows a typical oscillation of an LC sensor with a middle point $V_{MID}$ (which usually corresponds to 0.5 VDD) and the reference voltage $V_{Ref}$, which in the example is set to $V_{MID}$. Conversely, FIG. 11*b* shows an example in which the middle point voltage $V_{MID}$ has been raised to change the number of digital pulses instead of moving the voltage $V_{Ref}$.

Figure 11C:
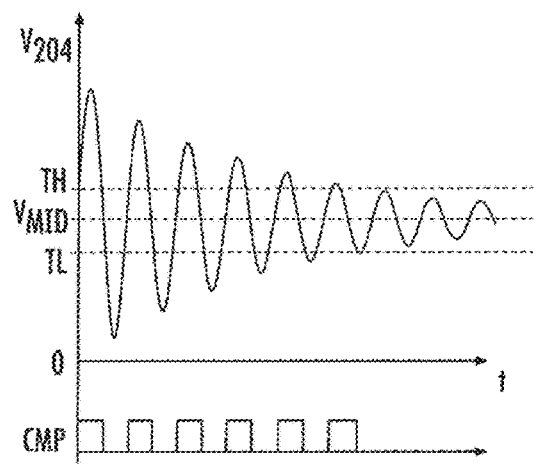
Figure 11D:
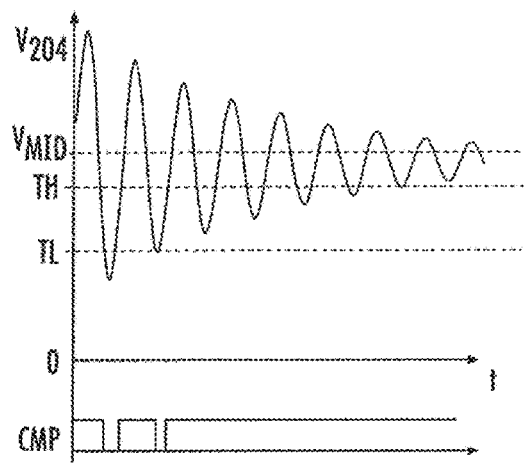

Similarly, FIG. 11*c* shows the waveform of FIG. 11*a*, in which a Schmitt Trigger has been used, e.g., with a lower threshold TL of 0.4 VDD and an upper threshold TH of 0.6 VDD. Finally, FIG. 11*d* shows the waveform of FIG. 11*b* with raised middle point voltage $V_{MID}$, and where the Schmitt Trigger of FIG. 11*c* has been used.

As shown in the above FIGS. 11*a* to 11*d*, the number of pulses at the output of the comparator 210 varies for the same waveform as a function of the middle point voltage $V_{MID}$. However, as mentioned above, the middle point voltage $V_{MID}$ varies as a function of the excitation time $T_{excit}$ during the charge transfer phase 2004. Thus, by controlling the time $T_{excit}$, the comparison result may be tuned.

Figure 12:
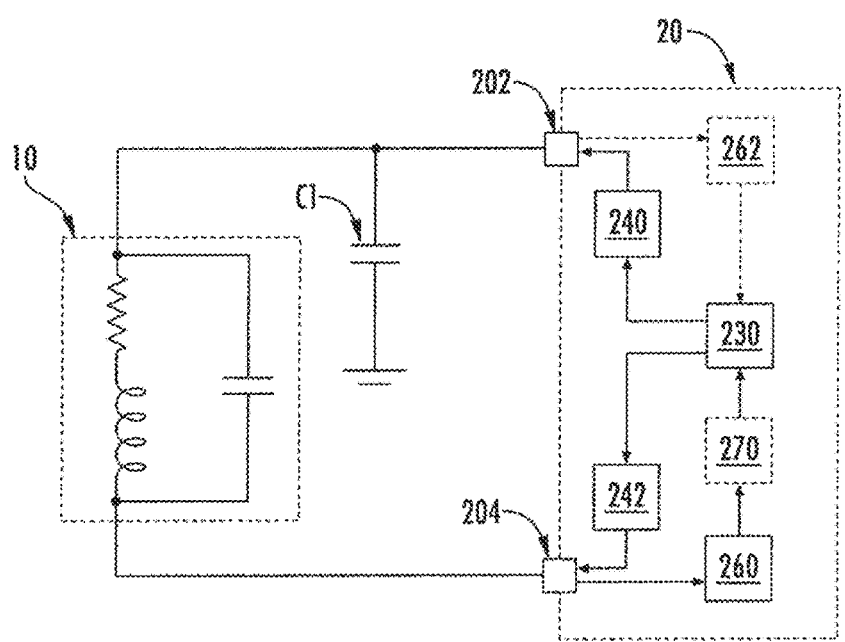

FIG. 12 shows in this context an embodiment of an integrated circuit 20, such as a microcontroller, which may be used to perform the above-noted operations. More specifically, pad 204 is an input and output pad with the associated three state output drive circuitry 242 and input sensing circuitry 260, such as a Schmitt Trigger. Pad 202 is at least an output pad with the associated three state output drive circuitry 240.

Accordingly, by driving the pads 202 and 204 via the driver circuitry 240 and 242 as described above, in particular with respect to FIG. 8, the oscillation of the LC sensor 10 may be stimulated and the middle point voltage $V_{MID}$ may be set. More specifically, the driving of the pads 202 and 204 may be performed via the digital processing core 230.

Once the oscillation has been started, the output from the sensing circuitry 260 is fed to the processing core 230 for further analysis to determine characteristics of the oscillation. For example, as shown with respect to FIGS. 5*a* and 5*b*, the output CMP is indicative for the damping factor of the oscillation, which in turn is indicative for the presence of a metallic object near the sensor 10. Generally speaking, the digital processing unit 230 may be a dedicated hardware module, a general-purpose processor programmed via software instructions or a combination of both.

Thus, counting of the pulses in the signal CMP may also be performed via the digital processing core. However, the oscillation may have a high frequency, in which case counting via software instructions may not be feasible. Accordingly, such this case the control unit 20 may include a hardware-implemented counter 270, which already is often included in conventional microcontrollers, and the output of the sensing circuitry 260 may be fed to the counter 270. Thus, the counter 270 may count the number of pulses in the signal CMP independently from the processing unit 230 and the processing unit 230 may only read the final result, i.e., the signal at the output of the counter 270, and eventually reset the counter 270 when a new measurement is started.

Moreover, the counter 270 may also be extended to provide a dedicate measurement and processing unit which directly elaborates the signal CMP to extract the information required. For example, the measurement and processing unit 270 may directly detect the sensor's state, such as over metal, over plastic, etc.

The module 270 may also generate at least on programmable interrupt on specific conditions. For example, such a measurement and processing unit may also be connected to a plurality of sensing pads 204 to elaborate the signal from a plurality of sensors, e.g., to perform a speed or rotation measurement.

As shown with respect to FIGS. 11a to 11d, the number of pulses at the output of the comparator 210 varies for the same waveform as a function of the middle point voltage $V_{MID}$. The middle point voltage $V_{MID}$ in turn varies as a function of the excitation time $T_{excit}$ during the charge transfer phase 2004.

In some embodiments, the Self-Tuning Reference (STR) technique looks directly at the number of digital pulses generated at the output of the comparator, e.g. the Schmitt Trigger 260 of FIG. 10 to automatically tune the excitation time $T_{excit}$ to be used in the CDCS technique described in the foregoing. In this way, a desired number of digital pulses may be achieved, which usually corresponds to a given reference condition (e.g., with metal). For example, the reference condition usually corresponds to the situation with the greatest damping factor, which corresponds to the oscillation with the lowest expectable number of pulses in the output CMP of the comparator 250/260. By way of example, in some embodiments a closed-loop regulation is used to set the time $T_{excit}$ to ensure that the number of pulse for a given reference condition, e.g., the condition with the greatest damping factor, corresponds to the target number of pulses K. In this case, when measuring the reference condition the number of pulses at the output of the comparator will include K counts, and the number of pulses will increase in condition with a lower damping factor.

For example, considering an exemplary case where the resistance R in the sensor 10 (which primarily models the damping behavior) may be between 3 and 45 Ohms, and the minimum number of count K should be 4, the calibration would be performed for the condition with R=45 Ohm. By way of example, for a typical LC sensor, the final results may then be:

4 pulses for R=45 Ohm;
5 pulses for R=37 Ohm; and
9 pulses for R=3 Ohm.

Moreover, the described calibration mechanism renders the system robust against variations of parameters which influence the oscillation. For example, FIG. 13 shows a table including the number of pulses in the signal CMP for different supply voltages VDD∈{3.3V, 2.V, 2.5V, 2.1V}, temperatures T∈{−30° C., 25° C., 125° C.}, and resistances R∈{3 Ohm, 37 Ohm, 45 Ohm}. As shown in FIG. 13, this approach is very robust against voltage variations, while the resolution may be affected by low temperatures.

In some embodiments, instead of performing the calibration only once, the Self-Tuning Reference technique may be run continuously and regulate the voltage $V_{MID}$, ensuring that the number of pulses in the signal CMP for a measurement is never smaller than K. For example, this may be useful for rotation sensors where a disc with a metal profile is rotated in front of at least one LC sensor 10, because in this case it may be difficult to establish a priori the correct reference condition. Thus, generally speaking, the Self-Tuning Reference technique may be performed by the digital processing unit 230 or also directly by the measurement and processing unit 270.

The STR technique may also be used to identify the direction to take when modifying the time $T_{excit}$ and/or cope with deadlocks, which may occur when the time $T_{excit}$ is out of the valid range. For example, in some embodiments, the following parameters may be used:

NP—number of pulses for the current measurement cycle;
PNP—number of pulses for the previous measurement cycle;
DIR—direction;
PDIR—previous direction;
K—target minimum number of pulses for a measurement;
$T_{excit}$—excitation time, e.g. in clock periods during which the capacitor $C_1$ transfers charge to the sensor 10; and
TO—timeout, e.g., in measurement cycles.

In some embodiments, when the number of measured pulses NP is less than the target K and less than pulses in the previous cycle PNP, a direction change may be forced, because it may be assumed that the time $T_{excit}$ should be corrected in the opposite direction. In some embodiments, a counter C is used to check whether the timeout condition occurs. For example, such a counter C may be incremented each time the number of measure pulses NP is less than K but equal to the previous one NPN. Accordingly, if this condition is true for TO measurement cycles, the parameter $T_{excit}$ is out of range, because there is no more sensitivity to a variation of $T_{excit}$. For example, in this case, the time $T_{excit}$ may be reset to its original value and the direction is changed.

Figure 14:
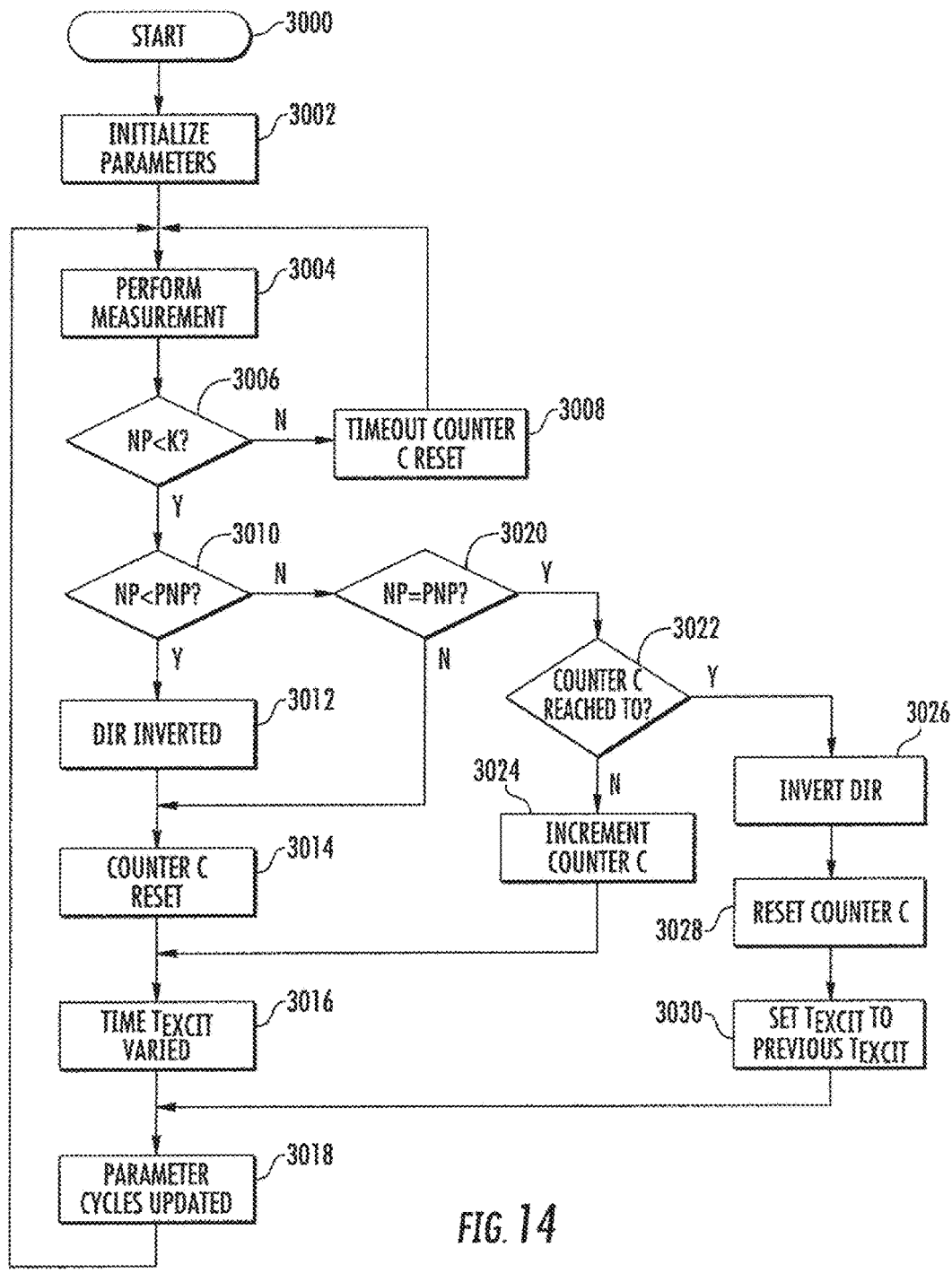

By way of example, FIG. 14 shows a flow chart of a method which may be used to automatically determine the time $T_{excit}$. After a start step 3000, the procedure starts and the parameters are initialized in a step 3002. For example, in this step 3002 the counter C may be reset (e.g., set to zero), the parameter PNP is set to zero, and the time $T_{excit}$ is set to an initial default value (e.g., zero).

The procedure continues at a step 3004 where a measurement is performed. If the calibration procedure is always switched on, the procedure may also merely monitor whether a measurement has been performed.

In a verification step 3006, the procedure verifies whether the measured number of pulses NP is less than the target value K. If the measured number of pulses NP is equal or greater than the target K (output "N" of the conditional step 3006), no correction is required and the procedure continues at a step 3008 where the timeout counter C is reset (e.g., set to zero), and the procedure returns to step 3004.

On the contrary, where the measured number of pulses NP is less than the target value K (output "Y" of the verification step 3006), some correction may be required and the procedure continues at a step 3010. Specifically, in the verification step 3010, the procedure verifies whether the measured number of pulses NP is less than the previous number of pulses PNP.

When the measured number of pulses NP is less than the previous number of pulses PNP (output "Y" of the verification step 3010), the direction DIR for the correction of the time $T_{excit}$ is inverted at a step 3012. For example, if the previous direction PDIR indicates that the time $T_{excit}$ should be decreased, the new direction DIR indicates now that the time $T_{excit}$ should be incremented. On the contrary, if the previous direction PDIR indicates that the time $T_{excit}$ should be incremented, the new direction DIR indicates now that the time $T_{excit}$ should be decremented.

Moreover, in this case the counter C is reset at a step 3014, and the time $T_{excit}$ is updated at a step 3016, e.g., by decrementing or incrementing the value of $T_{excit}$ based on the updated parameter DIR. For example, in an example embodiment the parameter $T_{excit}$ is varied merely by one clock cycle, i.e., $T_{excit}=T_{excit}\pm1$. However, the variation may depend on the velocity of the control unit, e.g., the frequency of the clock signal.

Finally, the parameters of the previous cycle are update at a step 3018, e.g., by assigning the value of the direction DIR to the previous direction PDIR and the value of the number of pulses NP to the previous number of pulses PNP. On the contrary, if the measured number of pulses NP is equal or greater than the previous number of pulses PNP (output "N" of the verification step 3010), the direction DIR for the correction of the time $T_{excit}$ is usually correct.

However, in this case it may be verified whether a timeout condition is reached. For example, in the embodiment considered, the procedure verifies whether the measured number of pulses NP is equal to the previous number of pulses PNP in a step 3020.

More specifically, if the number of measured pulses NP is not equal to the previous number of pulses PNP (output "N" of the verification step 3020) and taking into account that is has previously been verified that the measured number of pulses NP is not smaller than the previous number of pulses PNP (see step 3010), the measured number of pulses NP is greater than the previous number of pulses PNP. Accordingly, in this case the correction is going in the correct direction and the timeout counter C may be reset and the time $T_{excit}$ may be updated, i.e., incremented or decremented based on the current direction DIR. For example, in the present embodiment, the procedure simply proceeds at the step 3014 for this reason.

Conversely, in case the where number of measured pulses NP is equal to the previous number of pulses PNP (output "Y" of the verification step 3020), a timeout condition may be present. This is because the last variation of the time $T_{excit}$ did not influence the measured number of pulses.

Accordingly, in some embodiments, the procedure continues to increment or decrement the time $T_{excit}$ until a variation of the number of pulse occurs or a timeout is reached. For example, in the present embodiment, the procedure continues for this reason at a verification step 3022, in which the procedure verifies whether the counter C has reached the timeout value TO.

When the counter C has not reached the timeout value TO (output "N" of the verification step 3022), a single variation of the time $T_{excit}$ might have been insufficient, and the counter C is incremented in a step 3024. Moreover, in this case the procedure continues to vary the time $T_{excit}$ in the current direction, i.e., incremented or decremented $T_{excit}$ based on the current direction DIR. For example, in the present embodiment, the procedure proceeds at the step 3016 for this reason.

Conversely, if the counter C has reached the timeout value TO (output "Y" of the verification step 3022), a timeout condition occurred, i.e., variations of the time $T_{excit}$ do not influence anymore the number of pulses. In this case, a possible approach may be to see if variations in the opposite direction are suitable to reach the required number of pulses K. For example, in an example embodiment, the direction is inverted and the time $T_{excit}$ is set to the previous value before a timeout condition was reached.

In the present embodiment, the direction DIR for the correction of the time $T_{excit}$ may be inverted at a step 3026. For example, if the previous direction PDIR indicates that the time $T_{excit}$ should be decreased, the new direction DIR indicates now that the time $T_{excit}$ should be incremented. On the contrary, if the previous direction PDIR indicates that the time $T_{excit}$ should be incremented, the new direction DIR indicates now that the time $T_{excit}$ should be decremented.

Moreover, in this case the counter C is reset at a step 3028, and the time $T_{excit}$ is set to the previous value $T_{excit}$ at a step 3030. For example, if the new direction DIR indicates that the time $T_{excit}$ should be incremented, the timeout value TO may be added to the time $T_{excit}$, i.e. $T_{excit}=T_{excit}$ TO, thus turning back to the value of $T_{excit}$ prior to the timeout loop. On the contrary, if the new direction DIR indicates that the time $T_{excit}$ should be decremented, the timeout value TO may be subtracted from the time $T_{excit}$, i.e., $T_{excit}=T_{excit}-$TO.

Finally, the procedure may continue in this case at step 3018 to update the parameters of the previous cycle. For example, the convergence of the above described procedure has been verified with a conventional microcontroller for K=4 and TO=4.

In addition to the above-described methods for setting the minimum number of pulses K, a different approach may also be used to set the time $T_{excit}$. More specifically, in some embodiments, the voltage $V_{MID}$ is determined via a Schmitt Trigger connected to pad 202, e.g., a respective input circuitry 262 of the pad 202 (see, e.g., FIG. 12) similar to the one described for the pad 204.

Figure 15:
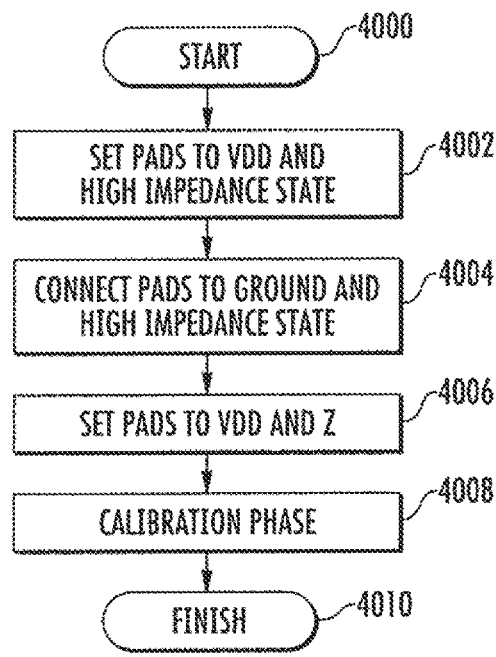
Figure 16:
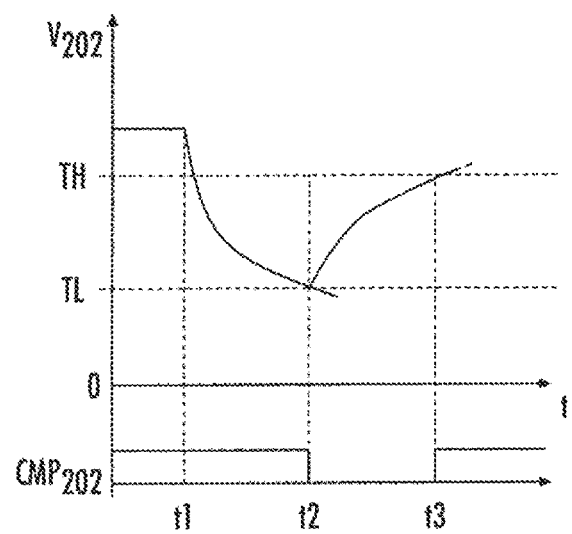

In an example embodiment, by driving the pads 202 and 204 and by monitoring the voltage at the pad 202 via a Schmitt trigger, it is possible to regulate the voltage $V_{MID}$. More specifically, FIG. 15 shows a calibration procedure and FIG. 16 shows a respective waveform of the voltage at pad 202, and thus the voltage $V_{MID}$ at the capacitor C1, for a given period of time t.

After a start step 4000, the control unit 20 sets in a step 4002 the pad 202 to the voltage VDD and the pad 204 to a high impedance state. For example, the processing unit 230 may drive the pin 202 with the logic level "1" and the pin 204 with the logic level "Z".

Accordingly, this condition corresponds to step 2002 described above with respect to FIG. 8. That is, only the capacitor C1 is connected between the supply voltage VDD and ground GND and the capacitor C1 is charged.

Once the voltage V202 at the pad 202 is stable (e.g., after a given period of time), the control unit 20 connects in a step 4004 (at time t1) the pad 204 to ground GND and sets the pad 202 to a high impedance state. For example, the processing unit 230 may drive the pin 202 with the logic level "Z" and the pin 204 with the logic level "0". Accordingly, this condition corresponds to step 2004 described with respect to FIG. 8, in which the sensor 10 is connected in parallel with the capacitor C1 and the charge on the capacitor C1 is transferred at least partially to the sensor 10. Accordingly, in this stage the voltage at pad 202 decreases as shown in FIG. 16.

In the present embodiment, the processing unit 230 monitors the logic level CMP202 at the output of the Schmitt Trigger 262 associated with the pad 202. In fact, while the voltage V202 remains above the lower threshold TL of the Schmitt Trigger, the signal CMP202 will be high, i.e., the logic level "1".

At the moment t2 when the signal CMP202 goes low, i.e., the logic level "0", the voltage V202 has reached the lower threshold TL. Immediately after having detected that the signal CMP202 has gone low, i.e., at the instant t2, the control unit 20 sets at step 4006 the pad 202 to the voltage VDD and the pad 204 is connected to Z.

Accordingly, at time t, the capacitor C, stored the following charge:

$$Q_{t1}=C1\cdot Vdd,$$

while the capacitor $C_1$ stored only the following charge at the time t2:

$$Q_{t2}=C1 \cdot TL,$$

i.e., the following charge has been transferred to the LC sensor 10:

$$Q_{LC}=Q_{t1}-Q_{t2}$$

Accordingly, at this moment the oscillation of the LC sensor 10 has been started and the pin 202 could also be disconnected or placed in a high impedance state. Conversely, in the embodiment considered, at this stage the capacitor C1, (i.e., pin 202) is connected again to the supply voltage VDD to recharge the capacitor C1, thus increasing the middle point voltage $V_{MID}$. By way of example, the processing unit 230 may drive the pin 202 with the logic level "1" and the pin 204 with the logic level "Z".

At the moment t3 when the signal CMP202 goes to high, (i.e., the logic level "1"), the voltage $V_{MID}$/V202 has reached the upper threshold TH. Thus, the time between t2 and t3 is indicative for the time required to charge the capacitor C1 from TL to TH.

Accordingly, the control unit 20 may detect during the calibration phase in a step 4008 the time elapsed between the instants t2 and t3 and perform during the normal operation a recharging with a recharge time $T_{recharge}$ determined as a function of the time elapsed, thus regulating the middle point voltage $V_{MID}$ to be used during the normal operation. For example, the maximum number of pulses in the signal CMP may be expected by setting the recharge time to:

$$T_{recharge}=(t_3-t_2)/2,$$

because in this case, the middle point voltage $V_{MID}$ should correspond more or less to:

$$V_{MID}=(TH-TL)/2.$$

For example, in some embodiments, the method shown in FIG. 8 is modified for this purpose, e.g., by adding an additional step between the step 2004 and the step 2006. Specifically, once the comparison signal CMP202 indicates that the voltage V202 at the first contact 202 is below the lower threshold TL, the first contact 202 is connected again to the supply voltage VDD such that said capacitor C1 is recharged through the supply voltage VDD. More specifically, the recharge duration $T_{recharge}$ of the capacitor C1 is determined as a function of the duration of the above duration t3−t2 of the calibration phase 4006, thereby defining the middle point voltage $V_{MID}$. Finally, the procedure terminates at a stop step 4010.

In some embodiments, instead of monitoring the recharge time between the thresholds TL and TH (i.e., t2 and t3), the procedure may monitor the discharge time between the thresholds TH and TL. For example, in an example embodiment, the procedure may again discharge the capacitor C1 after the step 4006, e.g., by using the driving describe with respect to step 4004. That is, once the voltage V202 has reached the threshold TH and the logic level goes to high, the pad 204 is connected to ground GND and the pad 202 is set to a high impedance state. Thus, by monitoring the time when the lower threshold TL is reached, i.e., when the logic level of CMP202 goes to low, it is possible to determine the discharge behavior and set the discharge time $T_{discharge}$ accordingly.

Generally speaking, this calibration procedure may also be performed periodically. Moreover, in some embodiments, the previously-described closed loop calibration methods (e.g., the method for setting the time $T_{excit}$ described with respect to FIG. 14), may also be used to regulate the times $T_{recharge}$ or $T_{discharge}$.

Accordingly, as described above, the Self-tuning Reference technique takes advantage of moving the external reference voltage $V_{MID}$ to avoid a variable internal reference signal. While the embodiments have been described in combination with the CDCS technique, generally speaking, this approach may be applied also to prior art approaches, in which the middle point voltage $V_{MID}$ is imposed via a voltage signal (see, e.g., FIG. 3*a*). Therefore, the Self-Tuning Reference (STR) technique automatically tunes the time $T_{excit}$ or directly the middle point voltage $V_{MID}$ to meet a target number of pulses regardless of the working parameters (and in general PVT variations).

The details of construction and the embodiments may vary with respect to what has been described and illustrated herein purely by way of example, without departing from the scope of the present disclosure, as defined by the ensuing claims.

What is claimed is:

1. A system, comprising:
   an LC sensor comprising an inductor and a first capacitor coupled in parallel to the inductor;
   a controller comprising a first contact and a second contact, wherein a first terminal of the first capacitor is coupled to form a node with the first contact of the controller, and wherein a second terminal of the first capacitor is coupled to form a node with the second contact of the controller; and
   a second capacitor coupled between the first contact of the controller and a reference voltage, wherein the controller is configured to:
   during a first phase, connect the first contact of the controller to a supply voltage and place the second contact of the controller in a high impedance state so that the second capacitor is charged through the supply voltage;
   during a second phase, place the first contact of the controller in the high impedance state and connect the second contact to the reference voltage so that the second capacitor transfers a charge to the first capacitor, wherein a residual charge remains in the second capacitor at an end of the second phase;
   during a third phase, place the first contact of the controller and the second contact of the controller in the high impedance state so that the LC sensor oscillates; and
   monitor an oscillation at the second contact of the controller during the third phase using a comparator to vary a duration of the second phase in order to regulate the residual charge in the second capacitor at a beginning of the third phase.

2. The system of claim 1, wherein the comparator comprises a comparator with hysteresis.

3. The system of claim 2, wherein the comparator with hysteresis comprises a Schmitt Trigger.

4. The system of claim 1, wherein the controller is configured to monitor the oscillation at the second contact of the controller during the third phase using the comparator by comparing a voltage at the second contact of the controller with a fixed reference value to generate a comparison signal.

5. The system of claim 4, wherein the controller comprises a processing circuit configured to receive the comparison signal.

6. The system of claim 4, wherein the controller is configured to monitor the oscillation at the second contact of the controller during the third phase by counting a number of pulses in the comparison signal.

7. A system, comprising:
an oscillator comprising a first capacitor;
a controller comprising a first contact and a second contact, wherein a first terminal of the first capacitor is coupled to form a node with the first contact of the controller, and wherein a second terminal of the first capacitor is coupled to form a node with the second contact of the controller; and
a second capacitor comprising a first terminal and a second terminal, wherein the first terminal of the second capacitor is coupled to form a node with the first contact of the controller, and wherein the second terminal of the second capacitor is coupled to receive a reference voltage, wherein the controller is configured to:
during a first time period, connect the first contact of the controller to a supply voltage and place the second contact of the controller in a floating state so that the second capacitor is charged through the supply voltage;
during a second time period, place the first contact of the controller in the floating state and connect the second contact of the controller to the reference voltage so that the second capacitor transfers a charge to the first capacitor, wherein a residual charge remains in the second capacitor at an end of the second time period;
during a third time period, place the first contact of the controller and the second contact of the controller in the floating state so that the oscillator generates a voltage at the second contact of the controller that oscillates about a midpoint voltage; and
monitor an oscillation of the voltage at the second contact of the controller during the third time period by comparing the voltage at the second contact of the controller against an upper threshold and a lower threshold to vary a duration of the second time period in order to regulate the residual charge in the second capacitor at a beginning of the third time period without varying the upper threshold or the lower threshold.

8. The system of claim 7, wherein the residual charge comprises a non-zero residual charge.

9. The system of claim 7, wherein the midpoint voltage is regulated by regulating the residual charge in the second capacitor at the beginning of the third time period.

10. The system of claim 7, wherein the controller is configured to monitor the oscillation of the voltage at the second contact of the controller during the third time period by generating a comparison signal, wherein the comparison signal is set to a first level when the voltage at the second contact of the controller is above the upper threshold, and to a second level when the voltage at the second contact of the controller is below the lower threshold.

11. The system of claim 10, wherein the controller is further configured to performing a calibration by:
during a first calibration phase, connecting the first contact of the controller to the supply voltage and placing the second contact of the controller in the floating state so that the second capacitor is charged through the supply voltage;
during a second calibration phase, placing the first contact of the controller in the floating state and connecting the second contact of the controller to the reference voltage so that the second capacitor transfers charge to the first capacitor;
during a third calibration phase, once the comparison signal indicates that the voltage at the second contact of the controller is below the lower threshold, connecting the first contact of the controller to the supply voltage so that the second capacitor is charged through the supply voltage; and
during a fourth calibration phase, once the comparison signal indicates that the voltage at the second contact of the controller is above the upper threshold, determining a duration of the third calibration phase.

12. The system of claim 7, wherein the comparator comprises a Schmitt Trigger.

13. A method, comprising:
during a first time period, connecting a first contact of a controller to a supply voltage and placing a second contact of the controller in a floating state so that a capacitor is charged through the supply voltage, wherein a first terminal of the capacitor is coupled to form a node with the first contact of the controller, wherein a second terminal of the capacitor is coupled to receive a reference voltage;
during a second time period, placing the first contact of the controller in the floating state and connecting the second contact of the controller to the reference voltage so that the capacitor transfers a charge to a further capacitor coupled between the first contact and the second contact of the controller, wherein a residual charge remains in the capacitor at an end of the second time period;
during a third time period, placing the first contact of the controller and the second contact of the controller in the floating state so that a voltage is generated at the second contact of the controller that oscillates about a midpoint voltage; and
monitoring an oscillation of the voltage at the second contact of the controller during the third time period by comparing the voltage at the second contact of the controller against an upper threshold and a lower threshold to vary a duration of the second time period in order to regulate the residual charge in the capacitor at a beginning of the third time period without varying the upper threshold or the lower threshold.

14. The method of claim 13, wherein monitoring the oscillation of the voltage at the second contact of the controller during the third time period comprises:
generating a comparison signal, wherein the comparison signal is set to a first level when the voltage at the second contact of the controller is above the upper threshold, and to a second level when the voltage at the second contact of the controller is below the lower threshold.

15. The method of claim 14, further comprising:
during a first calibration phase, connecting the first contact of the controller to the supply voltage and placing the second contact of the controller in the floating state so that the second capacitor is charged through the supply voltage;
during a second calibration phase, placing the first contact of the controller in the floating state and connecting the second contact of the controller to the reference voltage so that the second capacitor transfers charge to the first capacitor;
during a third calibration phase, once the comparison signal indicates that the voltage at the second contact of the controller is below the lower threshold, connecting the first contact of the controller to the supply voltage so that the second capacitor is charged through the supply voltage; and during a fourth calibration phase, once the comparison signal indicates that the voltage at the second contact of the controller is above the upper threshold, determining a duration of the third calibration phase.

16. The method of claim 14, wherein monitoring the oscillation of the voltage at the second contact of the controller during the third time period comprises counting a number of pulses in the comparison signal.

17. The method of claim 13, wherein the residual charge comprises a non-zero residual charge.

18. The method of claim 13, wherein the midpoint voltage is regulated by regulating the residual charge in the second capacitor at the beginning of the third time period.

19. The method of claim 13, wherein the comparator comprises a comparator with hysteresis.

\* \* \* \* \*

UNITED STATES PATENT AND TRADEMARK OFFICE
CERTIFICATE OF CORRECTION

PATENT NO. : 10,451,703 B2
APPLICATION NO. : 16/213534
DATED : October 22, 2019
INVENTOR(S) : Riccardo Condorelli et al.

Page 1 of 1

It is certified that error appears in the above-identified patent and that said Letters Patent is hereby corrected as shown below:

On the Title Page

Item (73) Assignee, Line 1, delete "STIMICROELECTRONICS" and insert --STMICROELECTRONICS--.

Signed and Sealed this
Twenty-eighth Day of April, 2020

Andrei Iancu
*Director of the United States Patent and Trademark Office*